United States Patent
Lee (10) Patent No.: US 10,761,646 B2
(45) Date of Patent: Sep. 1, 2020

(54) CAPACITANCE SENSOR WHICH CAN PROVIDE SUFFICIENT CAPACITANCE VALUE VARIATION NEAR EDGE

(71) Applicant: PixArt Imaging Inc., Hsin-Chu (TW)

(72) Inventor: Chia-Yi Lee, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 16/223,132

(22) Filed: Dec. 18, 2018

(65) Prior Publication Data

US 2019/0121487 A1 Apr. 25, 2019

Related U.S. Application Data

(63) Continuation of application No. 15/072,373, filed on Mar. 17, 2016, now Pat. No. 10,198,111.

(30) Foreign Application Priority Data

Jun. 11, 2015 (TW) .............................. 104118875 A (51) Int. Cl.
| | | |
|---|---|---|
| *G06F 3/041* | (2006.01) |
| *G06F 3/044* | (2006.01) |
| *H05K 1/02* | (2006.01) |
| *H05K 1/09* | (2006.01) |

(52) U.S. Cl.
CPC ............ *G06F 3/0416* (2013.01); *G06F 3/044* (2013.01); *G06F 3/0412* (2013.01); *H05K 1/0296* (2013.01); *H05K 1/09* (2013.01); *G06F 2203/04111* (2013.01); *H05K 2201/0326* (2013.01); *H05K 2201/10128* (2013.01)

(58) Field of Classification Search
CPC ...................................................... G06F 3/0416
USPC .......................................................... 345/173
See application file for complete search history.

(56) References Cited

U.S. PATENT DOCUMENTS

| | | | |
|---|---|---|---|
| 2011/0134052 A1 | 6/2011 | Tsai | |
| 2013/0240342 A1 | 9/2013 | Wang | |
| 2013/0241851 A1 | 9/2013 | Wang | |
| 2014/0028925 A1 | 1/2014 | Choi | |
| 2014/0225859 A1* | 8/2014 | Badaye | ................... G06F 3/044 345/174 |

(Continued)

FOREIGN PATENT DOCUMENTS

| | | |
|---|---|---|
| CN | 103309493 A | 9/2013 |
| CN | 103309494 A | 9/2013 |

(Continued)

*Primary Examiner* — Long D Pham
(74) *Attorney, Agent, or Firm* — Winston Hsu (57) ABSTRACT

A capacitance sensor, comprising: a plurality of first electrically conductive lines, wherein at least one side of two adjacent ones of the first electrically conductive lines respectively has a notch and the notches are opposite to each other; a second electrically conductive line, crossed with the first electrically conductive lines, wherein the second electrically conductive line further comprises a second protruding part protruding from the second electrically conductive line; wherein the second protruding part is located between the notches; wherein a distance between the two adjacent ones of the first electrically conductive lines at the side is larger than or equal to a maximum distance between the notches. Such capacitance sensor can provide sufficient capacitance value variation even at an edge region.

9 Claims, 6 Drawing Sheets

(56) References Cited

U.S. PATENT DOCUMENTS

| | | | |
|---|---|---|---|
| 2014/0285466 A1* | 9/2014 | Hayashi | G06F 3/044 |
| | | | 345/174 |
| 2015/0160758 A1 | 6/2015 | Chen | |
| 2015/0293624 A1* | 10/2015 | Chen | G06F 3/044 |
| | | | 345/174 |
| 2016/0202833 A1 | 7/2016 | Kim | |
| 2016/0320876 A1 | 11/2016 | Son | |
| 2016/0342237 A1 | 11/2016 | Ye | |

FOREIGN PATENT DOCUMENTS

| | | |
|---|---|---|
| CN | 203241970 U | 10/2013 |
| CN | 103902110 A | 7/2014 |
| CN | 104615318 A | 5/2015 |
| CN | 104699333 A | 6/2015 |
| TW | 201205377 A1 | 2/2012 |
| TW | M472895 U | 2/2014 |
| TW | M490615 U | 11/2014 |

\* cited by examiner

111
CAPACITANCE SENSOR WHICH CAN PROVIDE SUFFICIENT CAPACITANCE VALUE VARIATION NEAR EDGE

CROSS REFERENCE TO RELATED APPLICATIONS

This application is a continuation of applicant's earlier application, Ser. No. 15/072,373, filed 2016 Mar. 17, and is included herein by reference.

BACKGROUND OF THE INVENTION

1. Field of the Invention

The present invention relates to a capacitance sensor, and particularly relates to a capacitance sensor which can increase sensitivity for edge capacitance variation.

2. Description of the Prior Art

Figure 1:
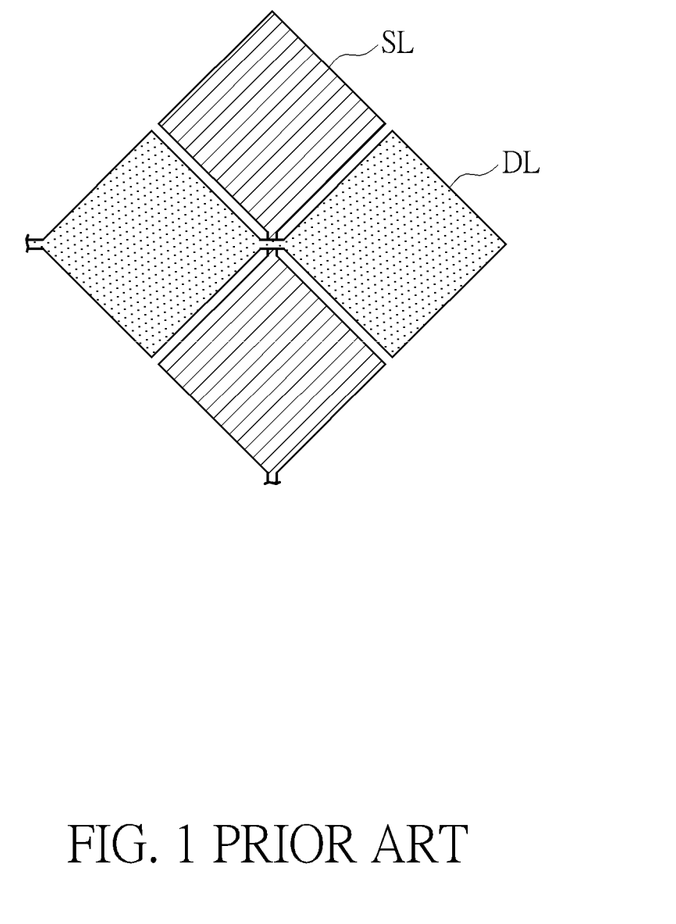
FIG. 1 is a schematic diagram illustrating driving lines and sensing lines in a prior art capacitance touch control apparatus.

In a prior art capacitance touch control apparatus, a capacitance sensor always comprises driving lines and sensing lines. As illustrated in FIG. 1, these lines comprise electrically conductive materials, thus capacitance exists there between. The capacitance touch control apparatus determines if any object such as a finger touches a touch control screen of the capacitance touch control apparatus according to a capacitance value for such capacitance.

The capacitance sensor may comprise various kinds of structures, for example, SITO (Single ITO), DITO (double ITO) and OGS (one glass solution). In the SITO and OGS structure, the driving lines and the sensing lines SL are provided in the same layer. Accordingly, an insulation layer is needed such that the two kinds of lines are not electrically conductive with each other. In the DITO structure, the driving lines and the sensing lines SL are provided in different layers.

However, in the edge of the touch control screen, it is possibly that only the driving lines or the sensing lines exist due to the arrangement for these lines. Accordingly, in the edge region of the touch control screen, the touch control function cannot be performed according to the capacitance variation.

SUMMARY OF THE INVENTION

One objective of the present invention is to provide a capacitance sensor, which can provide sufficient capacitance variation even at an edge region.

One objective of the present invention provides a capacitance sensor, comprising: a plurality of first electrically conductive lines, wherein at least one side of two adjacent ones of the first electrically conductive lines respectively has a notch and the notches are opposite to each other; a second electrically conductive line, crossed with the first electrically conductive lines, wherein the second electrically conductive line further comprises a second protruding part protruding from the second electrically conductive line; wherein the second protruding part is located between the notches; wherein a distance between the two adjacent ones of the first electrically conductive lines at the side is larger than or equal to a maximum distance between the notches.

Based upon above-mentioned embodiments, the electrically conductive structure provided by the present invention can provide sufficient capacitance value variation even at an edge region, thus the conventional issue can be solved.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
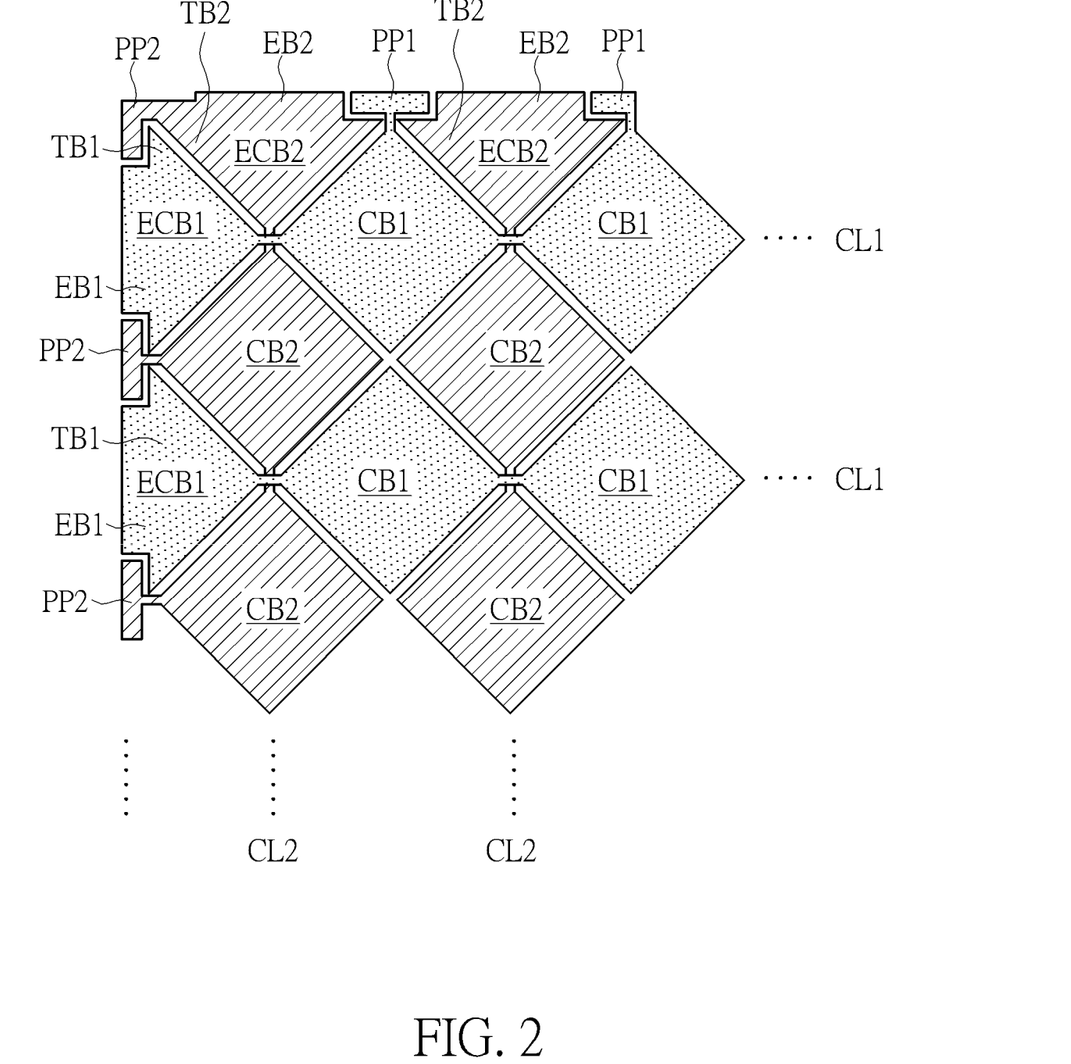
FIG. 2, FIG. 3 are schematic diagrams illustrating an electrically conductive structure according to embodiments of the present invention.
Figure 3:
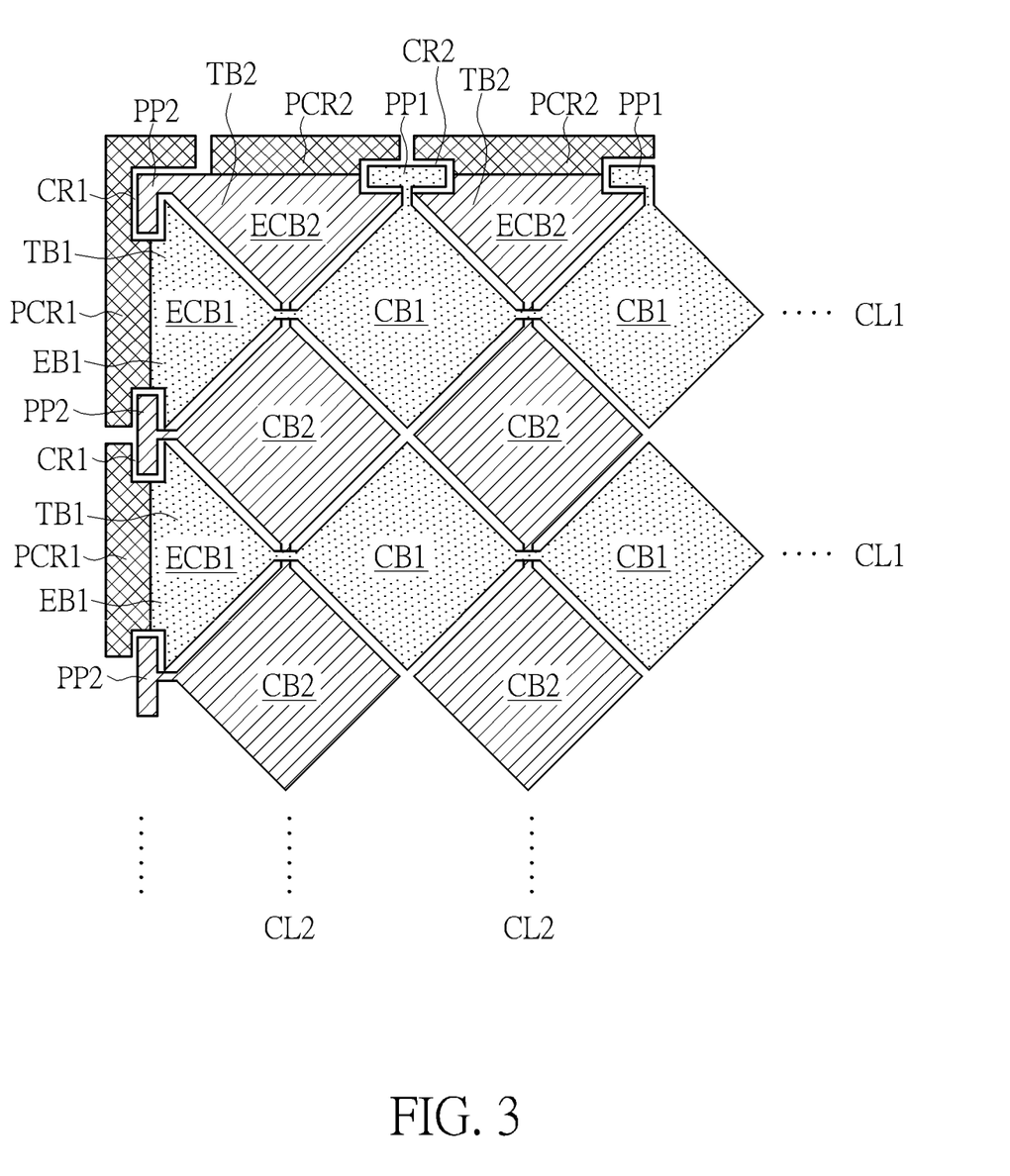

FIG. 2, FIG. 3 are schematic diagrams illustrating an electrically conductive structure according to embodiments of the present invention. FIG. 2 is an example without any peripheral electrically conductive region, and FIG. 3 is an example with at least one peripheral electrically conductive region. In the following embodiments, two kinds of electrically conductive lines are provided on the same layer (a single layer), but not limited.

As illustrated in FIG. 2, the first electrically conductive lines CL1 (ex. above-mentioned driving lines) respectively comprises a plurality of first electrically conductive blocks CB1 and a first edge electrically conductive block ECB1. In one embodiment, the first electrically conductive blocks CB1 are rhombus-shaped, and the first edge electrically conductive block ECB1 comprises a triangular electrically conductive block TB1 and an extension block EB1. Please note, the first electrically conductive blocks CB1 and the first edge electrically conductive blocks ECB1 can be other shapes. For example, the first electrically conductive blocks CB1 are elliptic-shaped and the first edge electrically conductive block ECB1 comprises a half-elliptic electrically conductive block TB1 and an extension block EB1. Such variation should fall in the scope of the present invention. The second electrically conductive line CL2 (ex. above-mentioned sensing lines) further comprises a second protruding part PP2, which extends from the second electrically conductive line CL2 and surrounds the extension block EB1 of the first edge electrically conductive block ECB1. In one embodiment, the second protruding part PP2 comprises at least one right angle (or T shape illustrated in FIG. 2), thereby the second protruding part PP2 can surround the extension block EB1. In one embodiment, an area of the second protruding part PP2 is smaller than an area for any electrically conductive block of the second electrically conductive line CL2. Also, the first electrically conductive line CL1 and the second electrically conductive line CL2 do not contact each other.

The electrically conductive structure provided by the present invention has similar structures at the other side. Take FIG. 2 for example, the second electrically conductive lines CL2 respectively comprises a plurality of second electrically conductive blocks CB2 and a second edge electrically conductive block ECB2. In one embodiment, the second electrically conductive blocks CB2 are rhombus-shaped, and the second edge electrically conductive block ECB1 comprises a triangular electrically conductive block TB2 and an extension block EB2. The first electrically conductive line CL1 further comprises a first protruding part PP1, which surrounds the extension block EB2 of the second edge electrically conductive block ECB2. In one embodiment, the first protruding part PP1 comprises at least one right angle (or T shape illustrated in FIG. 2), thereby the first protruding part PP1 can surround the extension block EB2. Please note, the right angle and the T shape do not mean to limit the scope of the present invention. The first protruding part PP1 can be any other shape, for example, an inverted triangular shape.

FIG. 3 is a schematic diagram illustrating the electrically conductive structure in FIG. 2 further comprises a peripheral electrically conductive region. As illustrated in FIG. 3, the first peripheral electrically conductive region PCR1 overlaps with a part of first electrically conductive lines CL1. In one embodiment, the first peripheral electrically conductive region PCR1 overlaps with an extension block for the first edge electrically conductive block ECB1 of the first electrically conductive line CL1 (EB1 in FIG. 2). Accordingly, the first peripheral electrically conductive region PCR1 and the first electrically conductive line CL1 have equal potentials. Furthermore, the first peripheral electrically conductive region PCR1 comprises a first containing region CR1, which is configured to contain a second protruding part PP2. Via such structure, the capacitance value variation for the capacitance between the first peripheral electrically conductive region PCR1 and the second protruding part PP2 can be applied to determine if an object is close even at an edge region, since the first peripheral electrically conductive region PCR1 and the first electrically conductive line CL1 have equal potentials. In one embodiment, the first peripheral electrically conductive region PCR1 does not contact with the second electrically conductive line CL2.

The electrically conductive structure provided by the present invention has similar structures at the other side. Please refer to FIG. 3 again, the second peripheral electrically conductive region PCR2 overlaps with an extension block for the second edge electrically conductive block ECB2 of the second electrically conductive line CL2 (EB1 in FIG. 2). Accordingly, the second peripheral electrically conductive region PCR2 and the second electrically conductive line CL2 have equal potentials. Furthermore, the second peripheral electrically conductive region PCR2 comprises a second containing region CR2, which is configured to contain the first protruding part PP1. Via such structure, the capacitance value variation for the capacitance between the second peripheral electrically conductive region PCR2 and the first protruding part PP1 can be applied to determine if an object is close even at an edge region, since the second peripheral electrically conductive region PCR2 and the second electrically conductive line CL2 have equal potentials. In above-mentioned embodiments, the first electrically conductive lines and the second electrically conductive lines comprise ITO (Indium Tin Oxide), and the peripheral electrically conductive region comprises metal, but not limited. The first electrically conductive lines, the second electrically conductive lines and the peripheral electrically conductive region can comprise other materials which can provide the same function, which are not limited to ITO and metal.

Figure 4:
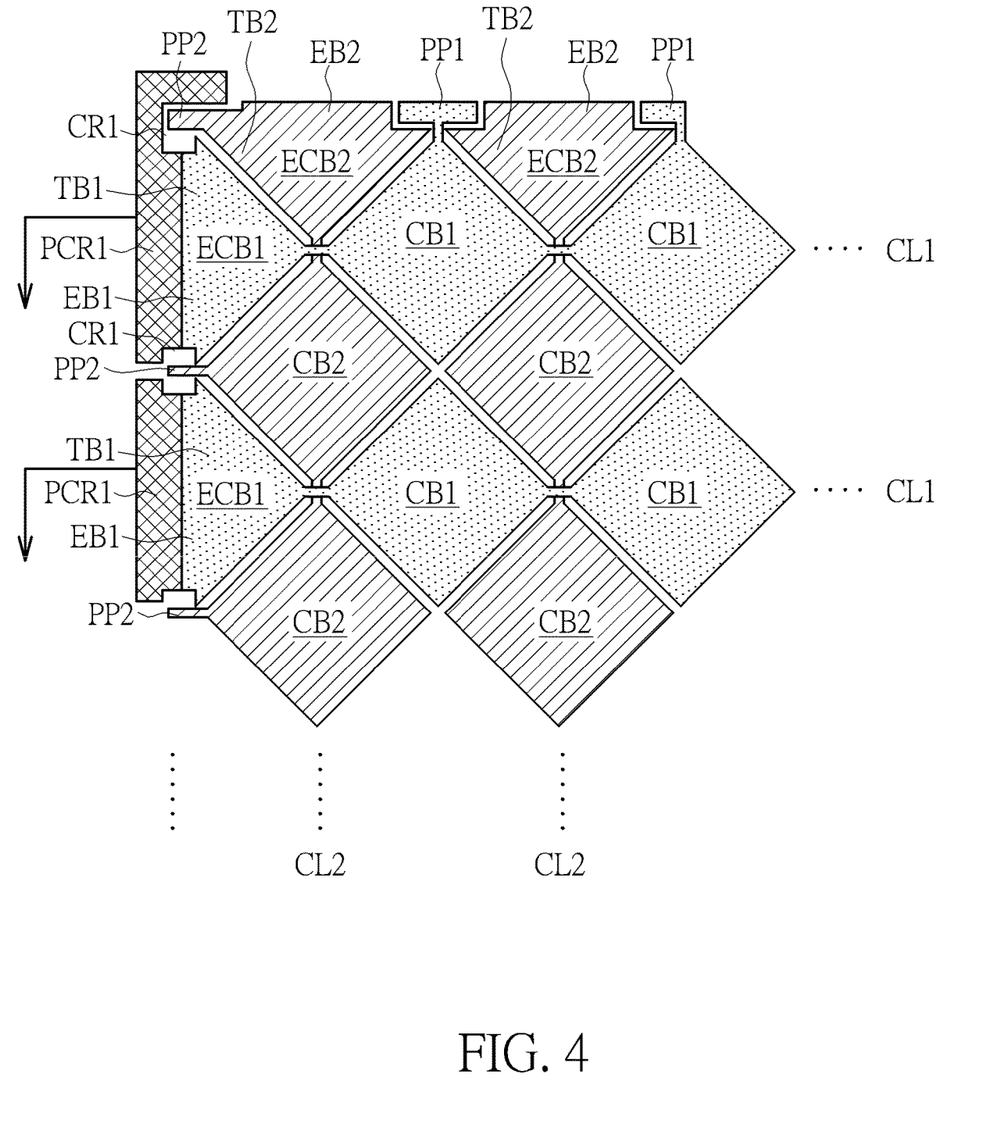
FIG. 4 is a schematic diagram illustrating an electrically conductive structure according to another embodiment of the present invention.

Besides it will be appreciated that a relation between a structure of the second protruding part PP2 and the first edge electrically conductive block ECB1 is not limited to the embodiment illustrated in FIG. 2. As illustrated in FIG. 4, the second protruding part PP2 is bar-shaped rather than comprises at least one right angle. Such variation should also fall in the scope of the present invention. Further, the electrically conductive structure can comprise the above-mentioned structure for only one side. For example, only comprises the second protruding part PP2 and does not comprise the first protruding part PP1.

Figure 5:
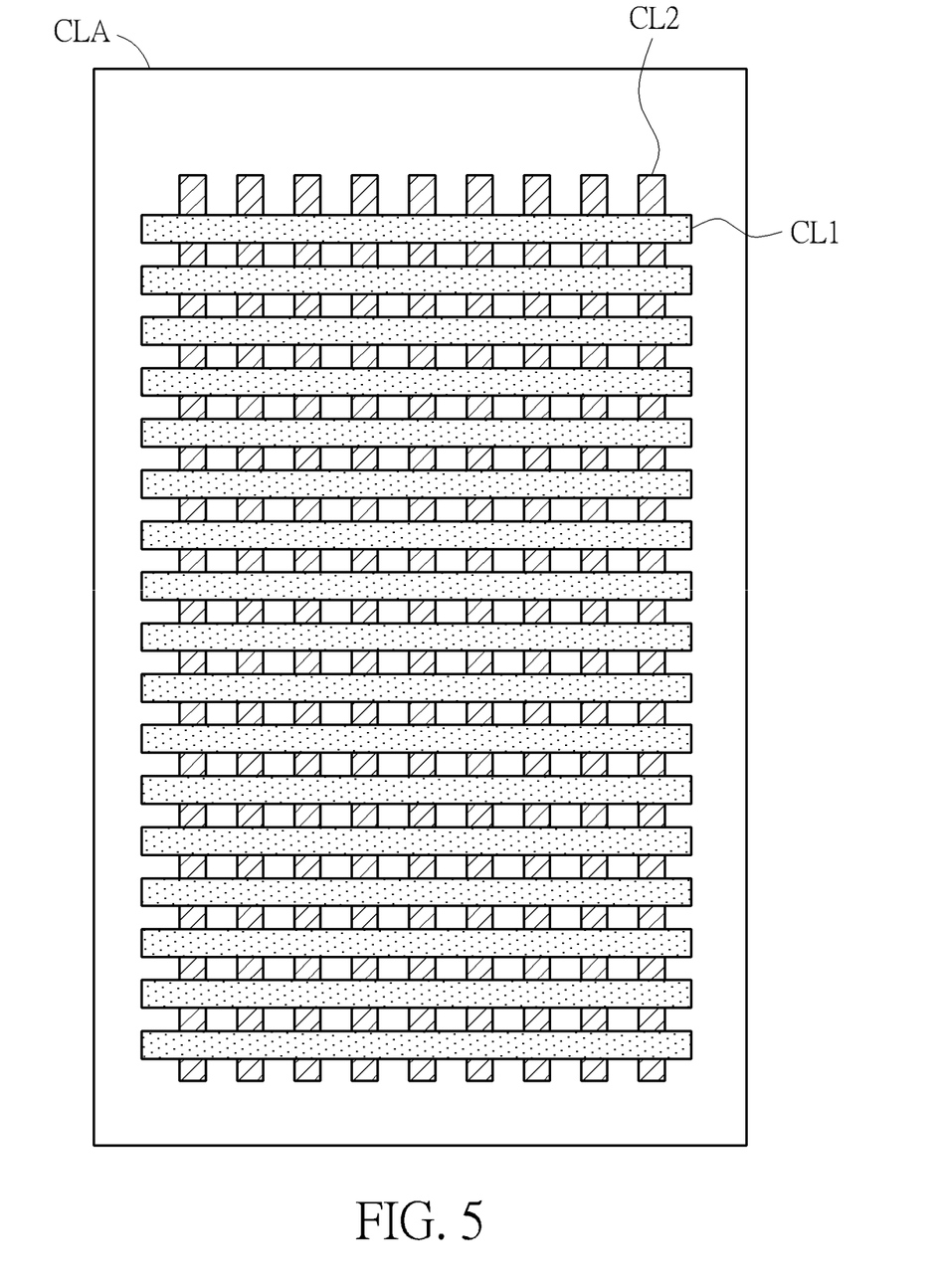
FIG. 5 is a schematic diagram illustrating arrangement for first electrically conductive lines and second electrically conductive lines according to another embodiment of the present invention.

FIG. 5 is a schematic diagram illustrating arrangement for first electrically conductive lines and second electrically conductive lines according to another embodiment of the present invention. As illustrated in FIG. 5, the first electrically conductive lines CL1 and the second electrically conductive lines CL2 are provided on the same electrically conductive layer CLA (i.e. a single conductive layer) and orthogonal to each other. However, the angles between the first electrically conductive lines and second electrically conductive lines can be any other degree. Further, please note FIG. 5 is only for explaining the arrangement for the first electrically conductive lines CL1 and the second electrically conductive lines CL2, thus some details such as electrically conductive blocks are omitted for brevity here.

Figure 6:
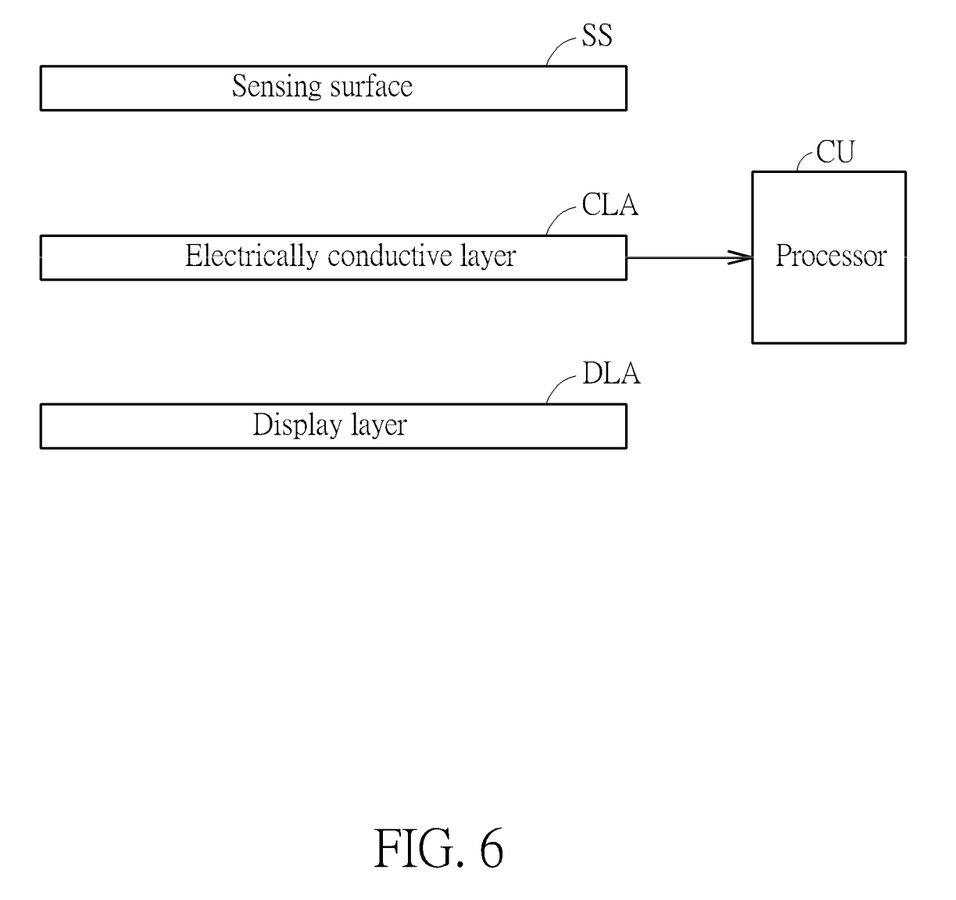
FIG. 6 is a schematic diagram illustrating a display apparatus and a capacitive touch control apparatus according to one embodiment of the present invention.

FIG. 6 is a schematic diagram illustrating a display apparatus and a capacitive touch control apparatus according to one embodiment of the present invention. As illustrated in FIG. 6, an electrically conductive layer CLA having above-mentioned electrically conductive structures can be provided below the sensing surface SS or above the display layer DLA. The sensing surface SS, for example, comprises a protecting layer and a light reflecting layer. An object such as a finger can move on the sensing surface SS to perform a touch control operation. The display layer DLA, for example, comprises a display and related layers such as a protecting layer or an electrically conductive layer, and is configured to display images. If an electronic apparatus comprises the sensing surface SS, the electrically conductive layer CLA and the display layer DLA, the electronic apparatus can be regarded as a capacitance touch control apparatus, which always comprises a processor CU. The processor CU is configured to determine if any object touches the sensing surface SS, according to at least one capacitance value between the above-mentioned first electrically conductive lines and the second electrically conductive lines, and according to at least one capacitance value between the above-mentioned second protruding part and the first peripheral electrically conductive region. Also, if an electronic apparatus comprises the electrically conductive layer CLA and the display layer DLA, the electronic apparatus can be regarded as a display apparatus. It will be appreciated that the electrically conductive structure provided by the present invention is not limited to be applied to a capacitance touch control apparatus or a display apparatus.

Based upon above-mentioned embodiments, the electrically conductive structure provided by the present invention can provide sufficient capacitance value variation even at an edge region, thus the conventional issue can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitance sensor, comprising:
at least one first electrically conductive line, comprises an extension block located at an edge of the capacitance sensor, wherein the edge has a rectangle shape, wherein partial of the extension block and partial of at least one T shape part form the edge;
at least one second electrically conductive line, comprising a plurality of second electrically conductive blocks, crossed with the first electrically conductive line, wherein at least one side of two adjacent ones of the second electrically conductive blocks respectively has the T shape part located at the edge, wherein the T shape parts of the two adjacent ones of the second electrically conductive blocks form a notch;
wherein the extension block is located in the notch;
wherein a distance between the two adjacent ones of the second electrically conductive blocks at the side is larger than or equal to a maximum distance between the notches;
wherein a total length of the extension blocks in the edge occupies a greater percentage of the edge than a total length of the T shape parts in the edge.

2. The capacitance sensor of claim 1, wherein the first conductive line and the second conductive line are orthogonal to each other.

3. The capacitance sensor of claim 1, wherein the first conductive line and the second conductive line are provided on a single electrically conductive layer.

4. The capacitance sensor of claim 1, wherein the extension block comprises at least one right angle.

5. The capacitance sensor of claim 1, wherein the T shape part extends from the second electrically conductive line which is closest to an edge of the capacitance sensor.

6. The capacitance sensor of claim 5, wherein an area of the T shape part is smaller than an area of the second electrically conductive block which the T shape part protrudes from.

7. The capacitance sensor of claim 5,
wherein the first electrically conductive line further comprises a plurality of first electrically conductive blocks and a first edge electrically conductive block;
wherein the first electrically conductive blocks are rhombus-shaped, and the second electrically conductive blocks are rhombus-shaped or triangular-shaped;
wherein the first edge electrically conductive block comprises a triangular electrically conductive block and the extension block, wherein the first peripheral edge electrically conductive block overlaps with the extension block;
wherein the T shape part surrounds the extension block.

8. The capacitance sensor of claim 1, wherein the distance between the two adjacent ones of the first electrically conductive lines at the side is larger than the maximum distance of the notch.

9. A capacitance sensor, comprising:
a plurality of first electrically conductive lines, wherein
at least one side of two adjacent ones of the first electrically conductive lines respectively has a notch and the notches are opposite to each other;
a second electrically conductive line, crossed with the first electrically conductive lines, wherein the second electrically conductive line further comprises a second protruding part protruding from the second electrically conductive line;
wherein the second protruding part is located between the notches;
I wherein a distance between the two adjacent ones of the first electrically conductive lines at the side is larger than or equal to a maximum distance between the notches;
wherein the first electrically conductive lines respectively comprises a plurality of first electrically conductive blocks, wherein the second electrically conductive lines respectively comprises a plurality of second electrically conductive blocks;
wherein at least one of the first electrically conductive line further comprises a first edge electrically conductive block;
wherein the first electrically conductive blocks are rhombus-shaped, and the second electrically conductive blocks are rhombus-shaped or triangular-shaped;
wherein the first edge electrically conductive block comprises a triangular electrically conductive block and an extension block, wherein the first edge electrically conductive block overlaps with the extension block;
wherein the second protruding part surrounds the extension block.

* * * * *